United States Patent
Malina et al.

(10) Patent No.: US 10,372,344 B2
(45) Date of Patent: Aug. 6, 2019

(54) READ TAIL LATENCY REDUCTION

(71) Applicant: Western Digital Technologies, Inc., Irvine, CA (US)

(72) Inventors: James N. Malina, Irvine, CA (US); Robert L. Horn, Yorba Linda, CA (US); Kent Anderson, Broomfield, CO (US); James C. Alexander, Newport Coast, CA (US); Albert H. Chen, Redmond, WA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/373,456

(22) Filed: Dec. 8, 2016

(65) Prior Publication Data

US 2018/0165016 A1 Jun. 14, 2018

(51) Int. Cl.
*G06F 3/06* (2006.01)
*H03M 13/37* (2006.01)

(52) U.S. Cl.
CPC ............ *G06F 3/0611* (2013.01); *G06F 3/064* (2013.01); *G06F 3/0619* (2013.01); *G06F 3/0653* (2013.01); *G06F 3/0659* (2013.01); *G06F 3/0673* (2013.01); *H03M 13/373* (2013.01); *H03M 13/3761* (2013.01)

(58) Field of Classification Search
CPC .. G06F 3/0611; G06F 11/1092; G06F 3/0673; G06F 3/0653; G06F 3/064; G06F 3/0619; G06F 3/0659; H03M 13/154
See application file for complete search history.

(56) References Cited

U.S. PATENT DOCUMENTS

| | | | |
|---|---|---|---|
| 8,738,855 B2 | 5/2014 | Spiegeleer et al. | |
| 8,914,669 B2 | 12/2014 | Dhuse et al. | |
| 9,053,114 B1 | 6/2015 | Lemar et al. | |
| 2011/0126045 A1 | 5/2011 | Bennett | |
| 2011/0185258 A1 | 7/2011 | Grube et al. | |
| 2013/0211809 A1* | 8/2013 | Maruyama | G06F 17/5031 703/21 |
| 2014/0026017 A1 | 1/2014 | Grube et al. | |
| 2014/0068320 A1 | 3/2014 | Vedpathak et al. | |
| 2015/0089328 A1 | 3/2015 | Lee et al. | |
| 2015/0234716 A1 | 8/2015 | Brooker et al. | |
| 2015/0254003 A1 | 9/2015 | Lee et al. | |
| 2015/0331744 A1 | 11/2015 | Slik | |
| 2016/0041868 A1 | 2/2016 | Davis et al. | |
| 2016/0062832 A1 | 3/2016 | Slik et al. | |
| 2016/0062833 A1 | 3/2016 | Slik | |

(Continued)

OTHER PUBLICATIONS

Brewer et al., Disks for Data Centers, White paper for FAST 2016, Google, Inc., Version 1.1, Feb. 23, 2016, 16 pgs; available at http://research.google.com/pubs/pub44830.html.

(Continued)

*Primary Examiner* — Thien Nguyen

(57) ABSTRACT

A collective latency indicator is determined that is associated with a latency in retrieving multiple erasure coded shards generated from an erasure coding on initial data. The collective latency indicator is compared to a latency limit, and a number of erasure coded shards to retrieve is adjusted based on the comparison of the collective latency indicator to the latency limit.

27 Claims, 11 Drawing Sheets

(56) References Cited

U.S. PATENT DOCUMENTS

| | | | |
|---|---|---|---|
| 2016/0062834 A1* | 3/2016 | Benight | G06F 11/1076 |
| | | | 714/766 |
| 2016/0062837 A1 | 3/2016 | Slik | |
| 2016/0277502 A1* | 9/2016 | Resch | G06F 11/2094 |
| 2017/0063704 A1* | 3/2017 | Krinsky | H04L 47/283 |
| 2017/0111477 A1* | 4/2017 | Davis | H04L 67/42 |
| 2017/0160966 A1 | 6/2017 | Baptist et al. | |
| 2017/0262191 A1 | 9/2017 | Dewakar et al. | |

OTHER PUBLICATIONS

Co-pending U.S. Appl. No. 15/256,522, filed Sep. 3, 2016, entitled "Write Latency Reduction".

Co-pending U.S. Appl. No. 15/373,450, filed Dec. 8, 2016, entitled "Read Tail Latency Reduction".

* cited by examiner

FIG. 3A

| Time | DSD/MP 1 | DSD/MP 2 | DSD/MP 3 | DSD/MP 4 | DSD/MP 5 | DSD/MP 6 | DSD/MP 7 | DSD/MP 8 | DSD/MP 9 | DSD/MP 10 | DSD/MP 11 | DSD/MP 12 | DSD/MP 13 | DSD/MP 14 | DSD/MP 15 | DSD/MP 16 | DSD/MP 17 | DSD/MP 18 | Total Shards Rec. |
|---|---|---|---|---|---|---|---|---|---|---|---|---|---|---|---|---|---|---|---|
| T1 | N | N | Y | N | Y | N | N | N | Y | N | N | Y | N | - | - | - | - | - | 4 |
| T2 | Y | N | Y | N | Y | N | N | Y | Y | Y | N | Y | Y | - | - | - | - | - | 8 |
| T3 | Y | <u>N</u> | Y | Y | Y | Y | Y | Y | Y | Y | Y | Y | Y | - | - | - | - | - | 12 |
| T4 | Y | <u>Y</u> | Y | Y | Y | Y | Y | Y | Y | Y | Y | Y | Y | - | - | - | - | - | 13 |

FIG. 3B

| Time | DSD/MP 1 | DSD/MP 2 | DSD/MP 3 | DSD/MP 4 | DSD/MP 5 | DSD/MP 6 | DSD/MP 7 | DSD/MP 8 | DSD/MP 9 | DSD/MP 10 | DSD/MP 11 | DSD/MP 12 | DSD/MP 13 | DSD/MP 14 | DSD/MP 11 | DSD/MP 12 | DSD/MP 13 | DSD/MP 14 | Total Shards Read |
|---|---|---|---|---|---|---|---|---|---|---|---|---|---|---|---|---|---|---|---|
| T1 | N | N | Y | N | Y | N | N | N | Y | N | N | Y | N | N | - | - | - | - | 4 |
| T2 | Y | N | Y | N | Y | N | N | Y | Y | Y | N | Y | Y | Y | - | - | - | - | 9 |
| T3 | <u>Y</u> | <u>N</u> | Y | Y | Y | Y | Y | Y | Y | Y | Y | Y | Y | <u>Y</u> | - | - | - | - | 13 |
| T4 | Y | Y | Y | Y | Y | Y | Y | Y | Y | Y | Y | Y | Y | Y | - | - | - | - | 14 |

READ TAIL LATENCY REDUCTION

BACKGROUND

Data Storage Devices (DSDs) are often used to record data on or to reproduce data from a storage media such as, for example, a rotating magnetic disk or a solid-state memory. In some cases, a DSD or a portion of the storage media in a DSD may become damaged or otherwise unreliable for storing data. To help protect against data loss, a data storage system or a DSD can store redundant data in different storage locations to provide a certain level of data reliability.

In one example, a data storage system can use erasure coding to protect against data loss by storing data as erasure coded shards in different storage locations. In erasure coding, data is broken into fragments that can be each expanded and encoded with redundant data to form an erasure coded shard.

Depending on the number of shards, a predetermined level of data reliability or durability can be achieved since the original data object can be reconstructed using less than all of the data shards. This can allow for the loss of some data shards while still being able to recover the original data. For example, where a data object is broken into thirteen fragments, the fragments can be encoded into eighteen erasure coded shards to provide for a predetermined level of data reliability referred to as a thirteen of eighteen configuration, or Erasure Coding (EC) 13/18. In this example, the eighteen shards are written in different storage locations in the data storage system and the original data object can be reconstructed using any thirteen of the eighteen data shards. This can allow for the retrieval of up to five of the eighteen shards to fail while still being able to reconstruct the original data.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

FIG. 3A is an example illustrating the receipt of a selected subset of erasure coded shards over time for reconstructing initial data according to an embodiment.

FIG. 3B is an example illustrating the receipt over time of more than the number of erasure coded shards shown in FIG. 3A according to an embodiment.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Example Environments

Figure 1A:
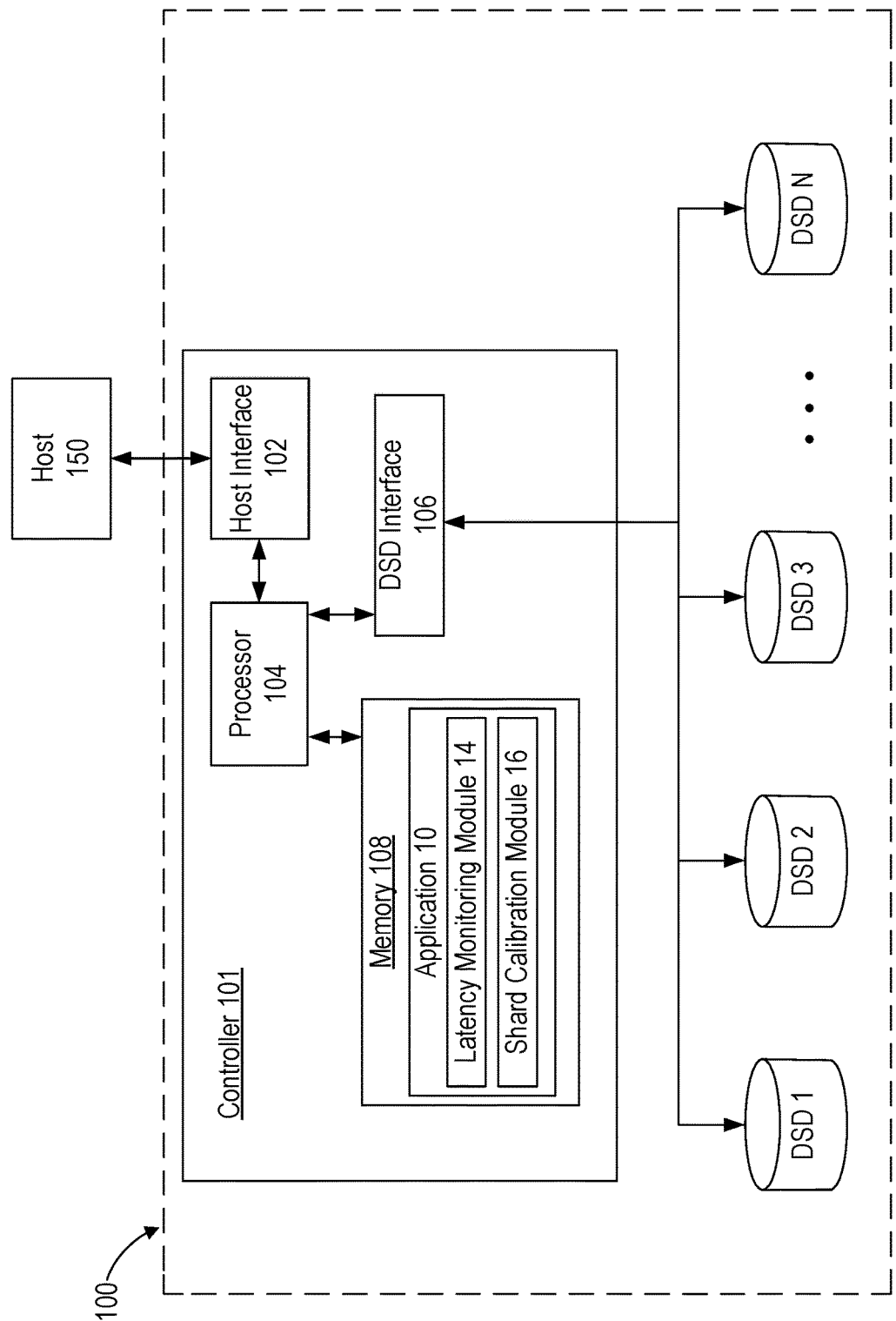
FIG. 1A is a block diagram of a data storage system including a controller according to an embodiment.

FIG. 1A is a block diagram of data storage system 100 according to an embodiment where erasure coded shards are stored in different Data Storage Devices (DSDs) of data storage system 100. As shown in FIG. 1A, data storage system 100 is accessed by host 150 to store and retrieve data from data storage system 100. Host 150 may, for example, use data storage system 100 for storing data remotely such as for a mobile or social media application executed by host 150 or for a distributed computing or big data application executed by host 150. In this regard, host 150 and data storage system 100 may or may not be physically co-located so that the connection between host 150 and data storage system 100 may include a local area network, a wide area network, or the internet. Examples of storing erasure coded shards can be found in co-pending U.S. patent application Ser. No. 15/256,522, filed on Sep. 3, 2016, and entitled "WRITE LATENCY REDUCTION", which is hereby incorporated by reference in its entirety.

In the example of FIG. 1A, data storage system includes controller 101 and DSDs 1 to N. DSDs 1 to N can include DSDs of a same type of storage media such as when all of DSDs 1 to N are Hard Disk Drives (HDDs) that use rotating magnetic disks as storage media or as when all of DSDs 1 to N are Solid-State Drives (SSDs) that store data in a solid-state storage media such as a flash memory. In other implementations, DSDs 1 to N may include a mix of different types of DSDs that may include different types of storage media, such as when DSDs 1 to N include both HDDs and SSDs.

While the description herein refers to solid-state memory generally, it is understood that solid-state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete Non-Volatile Memory (NVM) chips, or any combination thereof.

Data storage system 100 uses erasure coding to protect against data loss by storing data as erasure coded shards in different storage locations in DSDs 1 to N. As discussed above, erasure coding can include fragmenting the original or initial data into fragments that are each expanded and encoded with redundant data to form erasure coded shards. A predetermined level of data reliability is achieved by storing the shards in different storage locations, since the initial data can be recovered or reconstructed using less than all of the erasure coded shards. This allows for the initial data to be recovered even when some of the erasure coded shards cannot be retrieved.

In the example of FIG. 1A, data storage system 100 can receive a read command from host 150 to retrieve data that has been stored as erasure coded shards in one or more of DSDs 1 to N. Controller 101 sends read commands to one or more DSDs in data storage system 100 to retrieve at least a minimum number of erasure coded shards needed to recover the data requested by host 150. As discussed in more detail below with reference to FIGS. 3B and 4, the time it takes to recover the requested data can depend on the time it takes to retrieve the last erasure coded shard to be used to reconstruct the requested data.

In some cases, the time for retrieving the last erasure coded shard can be much longer than the time to retrieve the other erasure coded shards. This delay in retrieving the last erasure coded shard can be referred to as a "read tail latency" and can significantly affect the overall time it takes to complete a read command issued by host 150. In some situations, the overall time to complete a read command may need to meet a guaranteed maximum amount of time, such as with a Service Level Agreement (SLA).

According to one aspect of the present disclosure, a read tail latency is ordinarily reduced by selecting a particular subset of erasure coded shards to retrieve from the full set of erasure coded shards and recovering the original data using the erasure coding and the selected subset of shards. According to another aspect of the present disclosure, a read tail latency is ordinarily reduced by increasing the number of erasure coded shards to retrieve to shorten the time it takes to receive a lesser number of shards that will be used to recover the original data.

As shown in FIG. 1A, controller 101 of data storage system 100 includes host interface 102, processor 104, DSD interface 106, and memory 108. Host interface 102 is configured to interface controller 101 with host 150 and may interface according to a standard such as, for example, SATA, PCIe, SCSI, SAS, or a network standard such as an Ethernet standard.

DSD interface 106 is configured to interface controller 101 with DSDs 1 to N, and can interface according to a standard such as, for example, SATA, PCIe, SCSI, SAS, or an Ethernet standard. Although FIG. 1A depicts the co-location of controller 101 and DSDs 1 to N, in other embodiments they need not be physically co-located. For example, one or more of DSDs 1 to N can be located in a different room, building, or city than controller 101, another DSD, or host 150.

In the example of FIG. 1A, controller 101 includes processor 104 which can include circuitry such as one or more processors for executing instructions and can include a microcontroller, a Digital Signal Processor (DSP), an Application Specific Integrated Circuit (ASIC), a Field Programmable Gate Array (FPGA), hard-wired logic, analog circuitry and/or a combination thereof. In one implementation, processor 104 can include a System on a Chip (SoC).

Memory 108 can include, for example, a Dynamic Random Access Memory (DRAM) which can be used by controller 101 to temporarily store data. In the case where memory 108 is a volatile memory, data such as application 10 can be loaded into memory 108 as needed from a Non-Volatile Memory (NVM) of controller 101. In other implementations, memory 108 can be an NVM, such as a non-volatile solid-state memory.

Data stored in memory 108 can include data read from or written to DSDs 1 to N. Memory 108 can also be used by processor 104 to perform erasure coding on data received from host 150. In more detail, processor 104 may generate and store erasure coded shards in memory 108 before sending write commands to DSDs 1 to N to store the erasure coded shards. In other implementations, host 150 erasure codes data and sends the erasure coded shards to controller 101 for storage in DSDs 1 to N.

As shown in FIG. 1A, memory 108 can also store application 10, which includes computer-executable instructions that control retrieving erasure coded shards when executed by processor 104. In some implementations, processor 104 may also execute an object storage platform such as Ceph, Hadoop, Swarm, Amazon Simple Storage Service (S3), or OpenStack to store data objects such as photos, movies, e-commerce data, or archival data across DSDs 1 to N. In this regard, application 10 may be part of an object storage platform or serve as a stand-alone application.

As shown in the example of FIG. 1A, application 10 includes latency monitoring module 14 and shard calibration module 16. Other embodiments may include different modules for application 10.

As discussed in more detail below with reference to the implementation environment of FIG. 2, latency monitoring module 14 monitors latencies in performing commands for DSDs 1 to N. The monitored latencies may include latencies in performing read commands, write commands, or other commands, such as those associated with maintenance activities. In this regard, latency monitoring module 14 may only monitor latencies in performing read commands or may monitor latencies in performing different types of commands, such as for both read and write commands. In some implementations, the monitored latencies can provide or help determine individual latency indicators for each of DSDs 1 to N that are associated with retrieving shards from the DSD. In other implementations, the monitored latencies may provide or help determine a collective latency indicator associated with retrieving multiple shards from one or more DSDs.

Shard calibration module 16 can use the individual latency indicators or the monitored latencies to determine one or more collective latency indicators. Shard calibration module 16 can then select a subset and/or set a number of erasure coded shards to read by comparing one or more collective latency indicators to a latency limit.

Those of ordinary skill in the art will appreciate that other embodiments can include more or less than those elements shown in FIG. 1A and that the processes discussed below can be implemented in other environments. For example, other implementations can include a different number of hosts, controllers or DSDs, as in the example of FIG. 1B. As another example, each of DSDs 1 to N can include their own controller instead of sharing controller 101, or controller 101 may be replaced by a controller or other components located in one of DSDs 1 to N, as in the example of FIG. 1D.

Figure 1B:
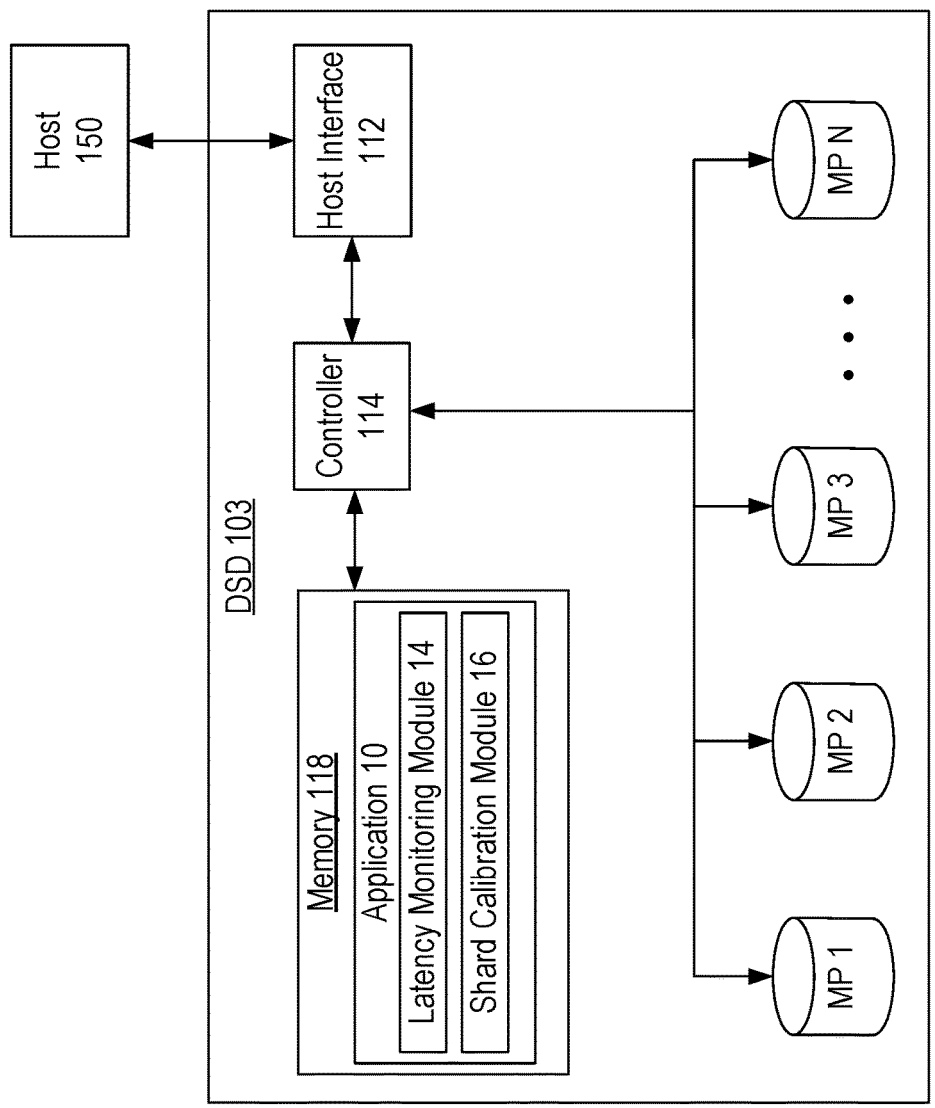
FIG. 1B is a block diagram of a Data Storage Device (DSD) including Memory Portions (MPs) according to an embodiment.

FIG. 1B is a block diagram of DSD 103 according to an embodiment where erasure coded shards are stored in different Memory Portions (MPs) of DSD 103 instead of in different DSDs of a data storage system. As compared to data storage system 100 in FIG. 1A, DSD 103 includes MPs 1 to N instead of DSDs 1 to N for storing erasure coded shards generated by controller 114 or host 150.

Each of MPs 1 to N can include, for example, one or more rotating magnetic disks and/or solid-state memories. In some implementations, MPs 1 to N can represent different portions of a single storage medium such as different dies, blocks, or pages within a solid-state memory or different zones of tracks or disk surfaces on a disk. Each MP may have its own sub-controller (not shown) that controls operation of the MP. In other implementations, MPs of a particular storage media type may share a sub-controller that controls operation of MPs of the same storage media type.

In the example of FIG. 1B, host interface 112 is configured to interface DSD 103 with host 150 and may interface according to a standard such as, for example, SATA, PCIe, SCSI, SAS, or a network standard such as an Ethernet standard.

DSD 103 also includes controller 114 which can include circuitry such as one or more processors for executing instructions and can include a microcontroller, a DSP, an ASIC, an FPGA, hard-wired logic, analog circuitry and/or a combination thereof. In one implementation, controller 114 can include an SoC.

Memory 118 can include, for example, a DRAM which can be used by DSD 103 to temporarily store data. In the case where memory 118 is a volatile memory, data such as application 10 can be loaded into memory 118 as needed from an NVM of DSD 103. In other implementations, memory 118 can be an NVM, such as a non-volatile solid-state memory.

Data stored in memory 118 can include data read from or written to MPs 1 to N. Memory 118 can also be used by controller 114 to perform erasure coding on data received from host 150. In more detail, controller 114 may generate and store erasure coded shards in memory 118 before sending write commands to MPs 1 to N to store the erasure coded shards. In other implementations, host 150 erasure codes data and sends the erasure coded shards to DSD 103 for storage in MPs 1 to N.

As shown in FIG. 1B, memory 118 can also store application 10, which includes computer-executable instructions for retrieving erasure coded shards when executed by controller 114. Application 10 includes latency monitoring module 14 and shard calibration module 16. Other implementations of application 10 may include different modules.

Latency monitoring module 14 monitors latencies in performing commands for MPs 1 to N. The monitored latencies may include latencies in performing read commands, write commands, or other commands, such as those associated with maintenance activities. In this regard, latency monitoring module 14 may only monitor latencies in performing one type of command, or may monitor latencies in performing different types of commands, such as for both read and write commands. In some implementations, the monitored latencies can provide or help determine individual latency indicators for each of MPs 1 to N that are associated with retrieving shards from the MP. In other implementations, the monitored latencies may provide or help determine a collective latency indicator associated with retrieving multiple shards from one or more MPs.

Shard calibration module 16 can use the individual latency indicators or the monitored latencies to determine one or more collective latency indicators associated with a latency in retrieving multiple erasure coded shards from one or more MPs. Shard calibration module 16 can then select a subset and/or set a number of erasure coded shards to retrieve by comparing one or more collective latency indicators to a latency limit.

Those of ordinary skill in the art will appreciate that other embodiments can include more or less than those elements shown in FIG. 1B and that the processes discussed below can be implemented in other environments.

Figure 1C:
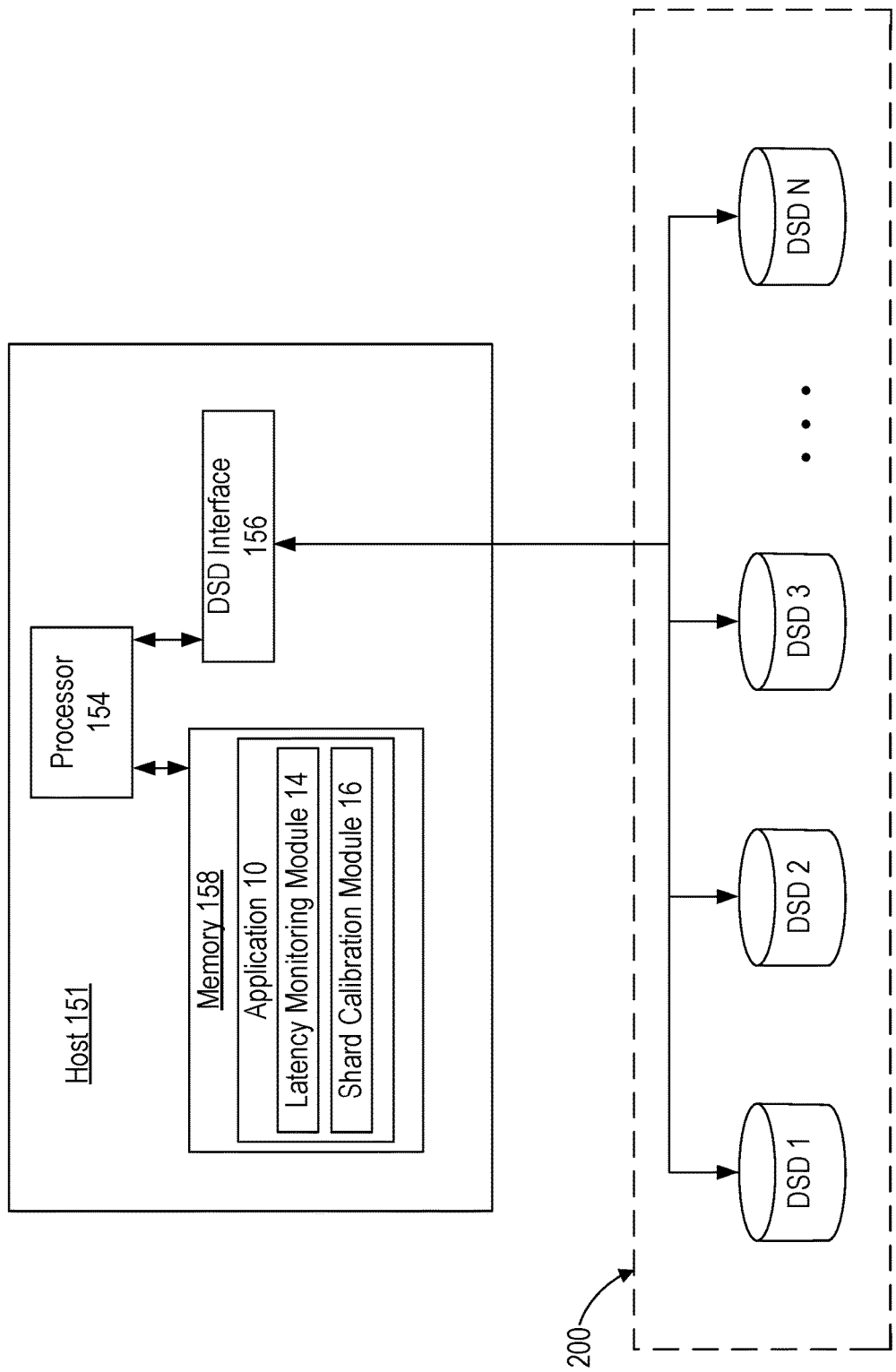
FIG. 1C is a block diagram of a host and a data storage system according to an embodiment.

As another example environment, FIG. 1C provides a block diagram of host 151 and data storage system 200 according to an embodiment where host 151 controls the retrieval of erasure coded shards. As shown in FIG. 1C, host 151 includes processor 154, DSD interface 156, and memory 158. Data storage system 200 includes DSDs 1 to N for storing data. As compared to host 150 in FIG. 1A, host 151 executes application 10 instead of controller 101 executing application 10 in FIG. 1A. In this regard, application 10 can be implemented at host 151 in FIG. 1C as part of, for example, a driver for communicating with data storage system 200, part of an Operating System (OS) of host 151, part of an object storage platform, or as a stand-alone application executing on host 151.

DSD interface 156 is configured to interface host 151 with DSDs 1 to N, and can interface according to a standard such as, for example, SATA, PCIe, SCSI, SAS, or an Ethernet standard. Although FIG. 1C depicts the co-location of host 151 and DSDs 1 to N, in other embodiments they need not be physically co-located. For example, one or more of DSDs 1 to N can be located in a different room, building, or city than host 151 or another DSD in data storage system 200.

In the example of FIG. 1C, host 151 includes processor 154 which can include circuitry such as one or more processors for executing instructions and can include a microcontroller, a DSP, an ASIC, an FPGA, hard-wired logic, analog circuitry and/or a combination thereof. In one implementation, processor 154 can include an SoC.

Memory 158 can include, for example, a DRAM which can be used by host 151 to temporarily store data. In the case where memory 158 is a volatile memory, data such as application 10 can be loaded into memory 158 as needed from a NVM of data storage system 200. In other implementations, memory 158 can be an NVM, such as a non-volatile solid-state memory.

Memory 158 can also be used by processor 154 to perform erasure coding on data to be sent to data storage system 200. In more detail, processor 154 may generate and store erasure coded shards in memory 158 before sending write commands to DSDs 1 to N to store the erasure coded shards.

Figure 1D:
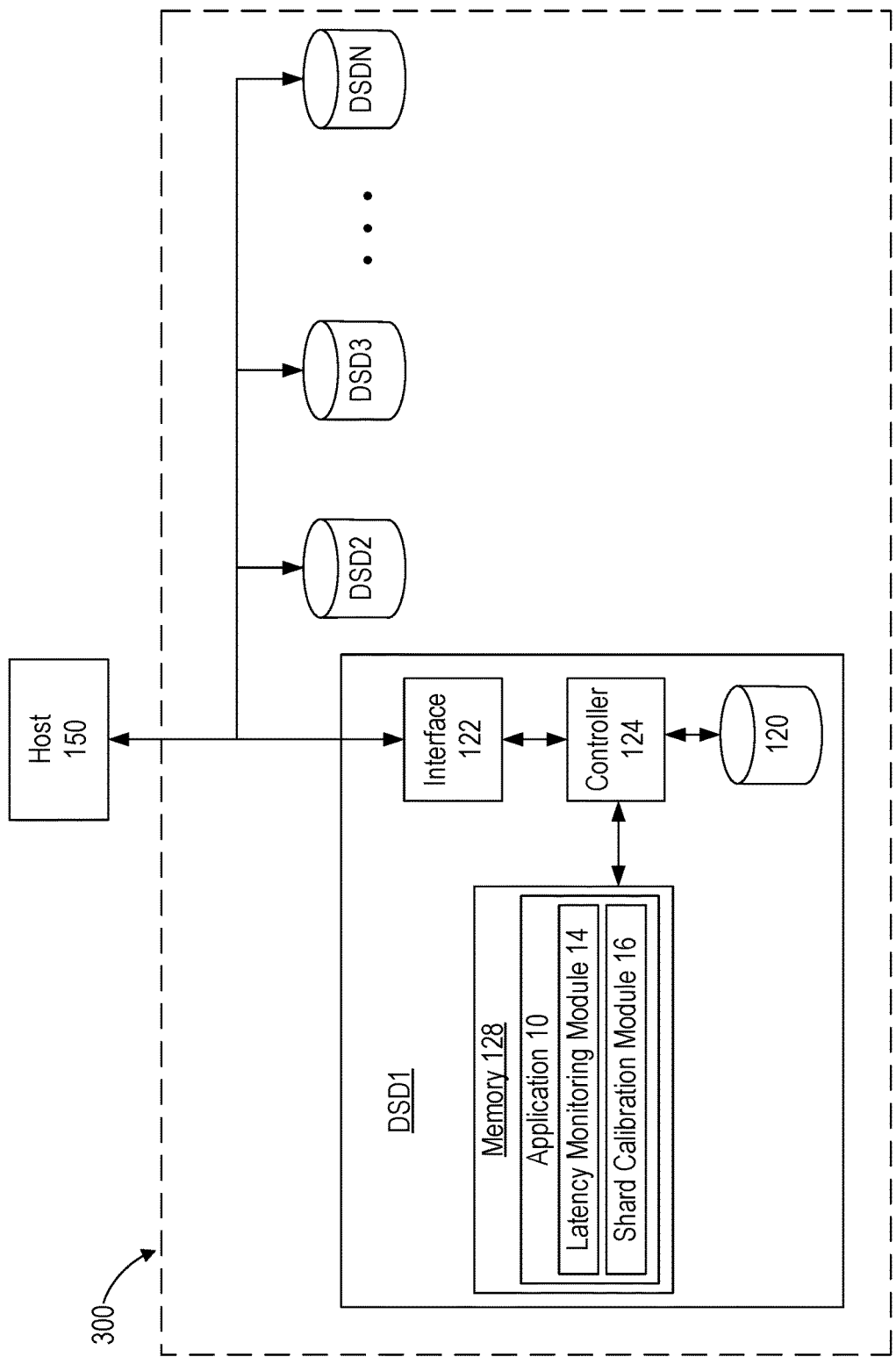
FIG. 1D is a block diagram of a DSD in a data storage system according to an embodiment.

FIG. 1D provides yet another implementation environment according to an embodiment where DSD 1 in data storage system 300 controls the retrieval of erasure coded shards in other DSDs in data storage system 300. As compared to data storage system 100 in FIG. 1, DSD 1 in FIG. 1D takes on the role of controller 101 in sending read commands to retrieve erasure coded shards in DSDs 2 to N. In some implementations, DSD 1 may also store one or more erasure coded shards in its own memory or MP 120. The erasure coded shards may be generated by controller 124 of DSD 1 or by host 150.

In some implementations, controller 124 may execute an object storage platform as part of application 10 stored in memory 128 or as a separate application. Examples of such storage platforms can include Ceph, Hadoop, Swarm, Amazon S3, or OpenStack to store data objects such as photos, movies, e-commerce data, or archival data across DSDs 1 to N.

As shown in FIG. 1D, interface 122 is configured to interface DSD 1 with host 150 and with other DSDs in data storage system 300 (i.e., DSDs 2 to N). Interface 122 may use a standard such as, for example, SATA, PCIe, SCSI, SAS, or a network standard such as an Ethernet standard. In some implementations, a separate interface may be used for host 150 and DSDs 2 to N.

Each of DSDs 1 to N may include non-volatile memory or MPs, such as one or more rotating magnetic disks and/or solid-state memories. Each DSD may also have its own controller that controls operation of the DSD. In some implementations, any of DSDs 1 to N can include a controller, such as controller 124, to control the storage of erasure coded shards in DSDs and perform the example processes discussed below.

Figure 2:
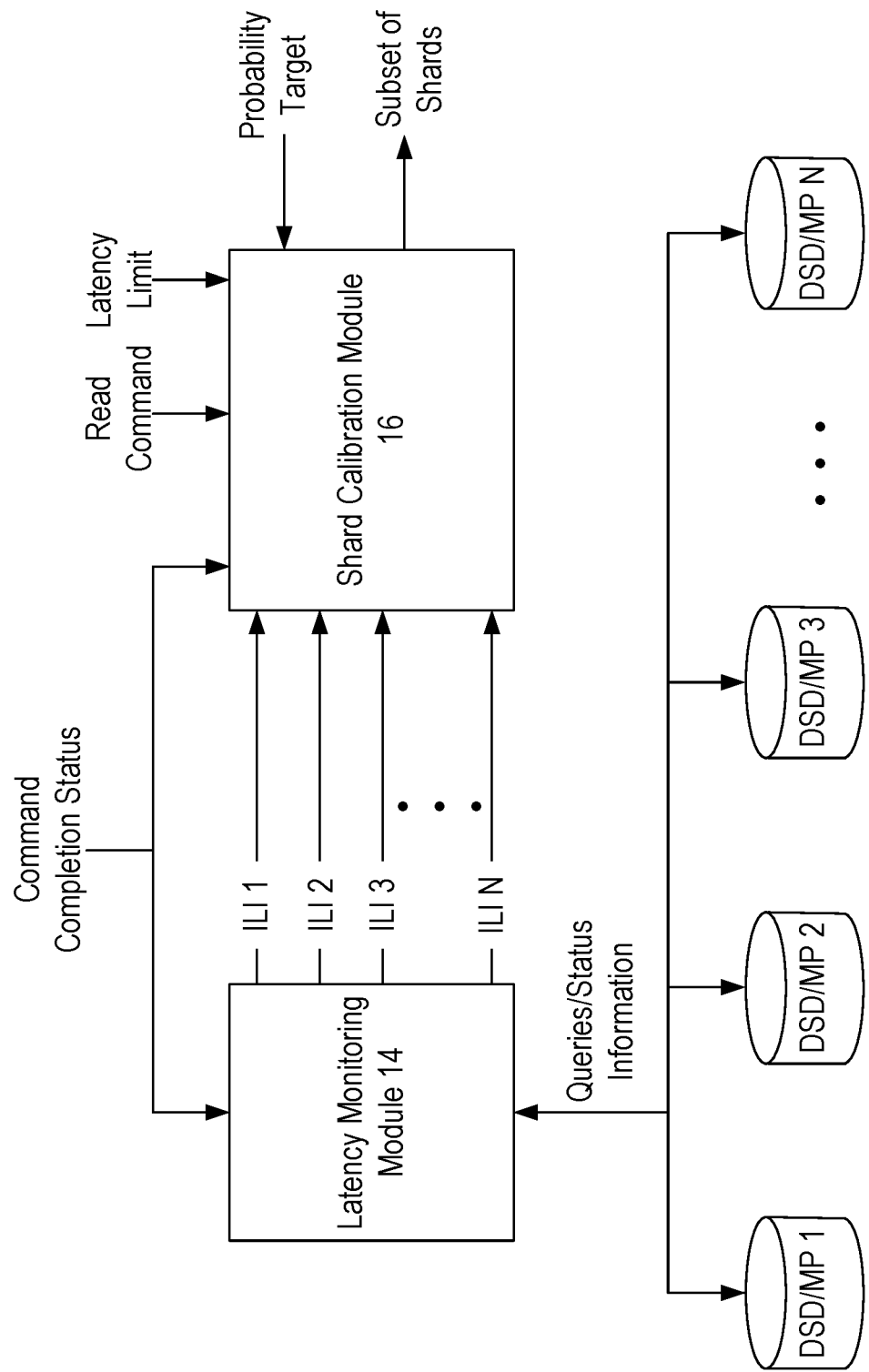
FIG. 2 is a block diagram of an implementation environment according to an embodiment.

FIG. 2 is a block diagram of an implementation environment showing the interaction of latency monitoring module 14 and shard calibration module 16 according to an embodiment. As shown in FIG. 2, latency monitoring module 14 queries DSDs/MPs 1 to N to receive status information for DSDs/MPs 1 to N. In the case of a MP, latency monitoring module 14 may query a sub-controller that controls operation of the MP.

Examples of status information can include an activity level or physical characteristics of the DSD or MP. The activity level of a particular DSD or MP may, for example, indicate a number of pending commands (e.g., write commands and/or read commands) queued for the DSD or MP, an average command queue depth over a predetermined period of time, a time to complete a command, or an average time to complete commands.

A physical characteristic of a particular DSD or MP may include, for example, a storage media type (e.g., rotating magnetic disk or solid-state memory), a location on a network, an age of the DSD or MP, a remaining available storage capacity of the DSD or MP, or a read speed specified for the DSD or MP. In this regard, certain DSDs or MPs may have a faster read speed than other DSDs or MPs due to physical differences such as having a faster actuator for seeking to a location on a disk, being able to rotate a disk at a higher rotational speed, or using a physically different type of solid-state memory (e.g., MRAM versus NAND, the number of bits per cell at which NAND is read, etc.).

Latency monitoring module 14 can also receive a command completion status that may be sent back to a host (e.g., host 151 in FIG. 1C or host 150 in FIG. 1A, 1B, or 1D) after completing a command issued by the host. Latency monitoring module 14 may use the status information received from the DSDs/MPs and/or the command completion status to determine Individual Latency Indicators (ILIs) 1 to N, which are associated with a latency in reading an erasure coded shard stored in a respective DSD or MP. In some implementations, the ILIs can include a time to retrieve the last erasure coded shard from the DSD/MP or an average time to retrieve erasure coded shards from the DSD/MP. In another implementation, the ILIs can serve as weights assigned to each DSD/MP corresponding to a latency in reading data from the DSD/MP.

In the example of FIG. 2, ILIs 1 to N are used by shard calibration module 16 to determine at least one collective latency indicator associated with a latency in retrieving multiple erasure coded shards. Shard calibration module 16 may also use a read completion status for previous read commands issued by a host to determine one or more collective latency indicators associated with a latency in retrieving multiple erasure coded shards. The collective latency indicators could include, for example, estimated times for retrieving different sets of erasure coded shards from the full set of erasure coded shards stored for the data requested by a read command issued by a host.

As shown in FIG. 2, shard calibration module 16 receives a read command for erasure coded data to be retrieved from DSDs/MPs 1 to N, and provides a selected subset of erasure coded shards to retrieve based on a comparison of at least one collective latency indicator to a latency limit for retrieving erasure coded shards. In some implementations, shard calibration module 16 may also use a probability target in comparing one or more collective latency indicators to the latency limit. As discussed in more detail below with reference to FIG. 4, the probability target can indicate a probability of exceeding the latency limit. The probability target can correspond to a design specification such as, for example, ensuring that at least 99% (or other desired target) of all read commands are completed within a predetermined time limit.

Read Tail Latency Reduction Examples

FIGS. 3A and 3B illustrate examples showing the receipt of erasure coded shards over time in performing a read command for requested data. In the example of FIG. 3A, read commands are sent to retrieve a subset of erasure coded shards selected by shard calibration module 16. The requested data has been erasure coded with an Erasure Coding (EC) 13/18. In other words, the requested data can be reconstructed with only the 13 of the 18 shards, with the additional 5 shards used to ensure data reliability should some of the DSDs/MPs storing the 18 experience a failure. In various embodiments, the subset of the 18 shards to be requested for reconstruction are selected by shard calibration module 16. To improve latency, the selection can center on one or both of two dimensions: (1) what shards are selected to be requested for retrieval, and (2) how many shards are selected.

In the example of FIG. 3A, which corresponds to dimension (1), shard calibration module 16 has selected the erasure coded shards stored in each of DSDs/MPs 1 to 13 as a subset of the erasure coded shards stored in DSDs/MPs 1 to 18 to increase the probability of completing the read command within a latency limit. For example, the individual latency indicators for DSDs or MPs 14 to 18 may associate these DSDs or MPs with a longer expected latency for retrieving data than DSDs/MPs 1 to 13.

As shown in FIG. 3A, only four shards have been received at T1. By time T2, eight shards have been received, and by time T3, twelve shards have been received. The recovery of the initial data cannot begin until T4 when the last of the selected shards is received from DSD/MP 2 to provide the thirteen shards needed to recover the requested or initial data. As a result, the overall read latency for returning the requested data depends on the slowest DSD or MP to read and send its shard or shards. This, in turn, can reduce the performance of other components, such as where a host or other device requesting the data must wait for the data to be returned before executing or issuing other commands.

FIG. 3B is an example illustrating the receipt over time of more than the selected subset of erasure coded shards shown in FIG. 3A according to an embodiment. Thus, FIG. 3B illustrates selection dimension (2) (number of shards) discussed above. In comparison to the example of FIG. 3A, shard calibration module 16 increases the number of shards to be retrieved (from thirteen to fourteen) to reduce the time by which the minimum number of shards needed for data reconstruction are received, from time T4 to T3. As shown in FIG. 3B, thirteen shards have been received by time T3 with the receipt of the erasure coded shard from DSD/MP 14 at time T3, which is before receipt of the shard from DSD/MP 2 at time T4. The observed slower performance of DSD/MP 2 may factor into future shard selections. In certain implementations, for future read commands, shard calibration module 16 may replace a read command to DSD/MP 2 with a read command to DSD/MP 14.

Figure 4:
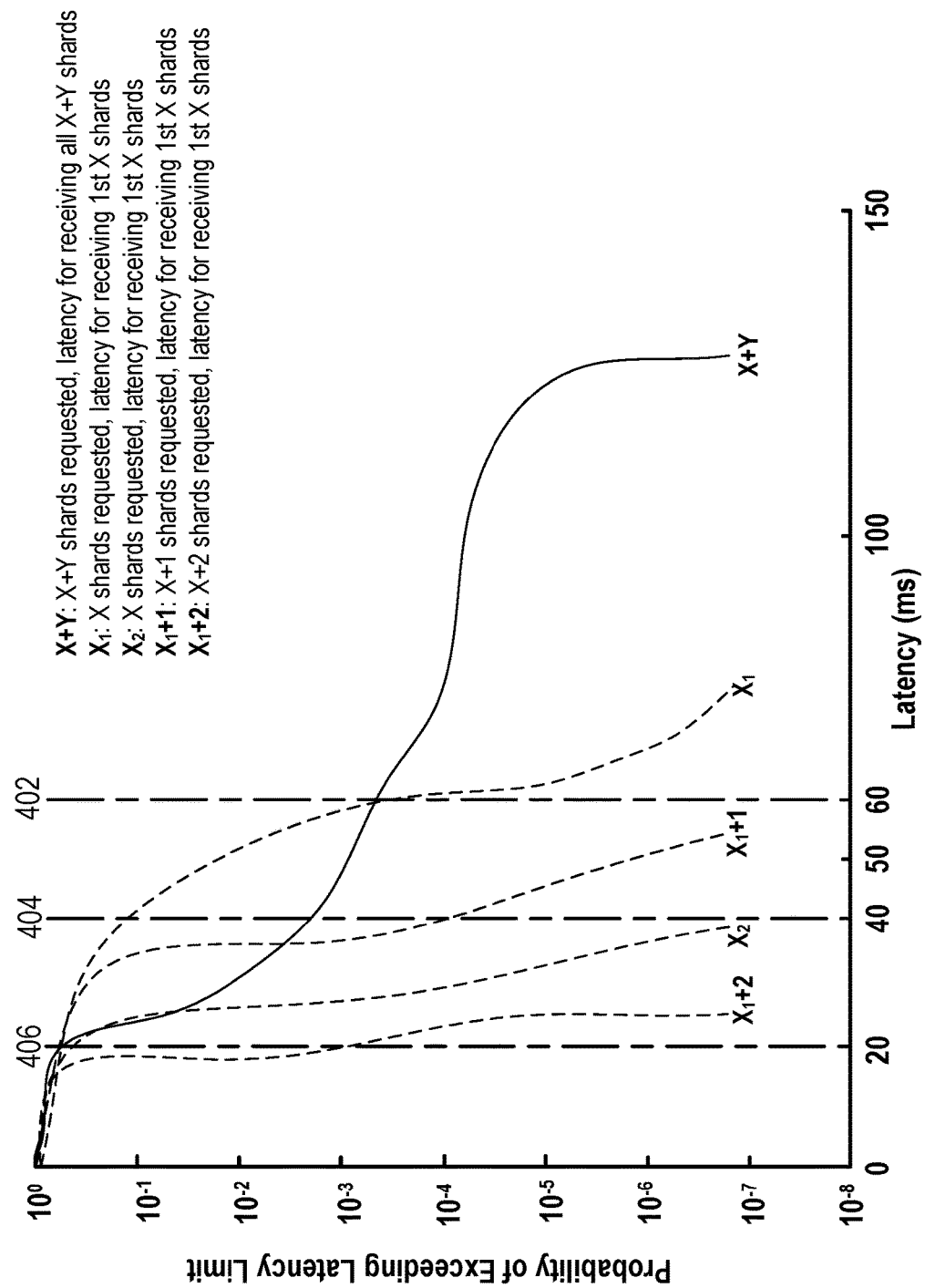
FIG. 4 is a graph correlating read latency and the probability of exceeding a latency limit for different subsets of erasure coded shards according to an embodiment.

FIG. 4 further demonstrates the latency reducing advantages of selecting different subsets of erasure coded shards to read and adjusting the number of shards to be read. In the example of FIG. 4, X represents the minimum number of shards needed to recover the original data, and Y represents an additional number of shards that have been stored for data reliability. For example, in the case where the level of data reliability is EC 13/18, X is 13 and Y is 5, such that X+Y provides a total number of 18 stored shards for the initial data. FIG. 4 compares the time it takes for all of X+Y shards to be retrieved to the various times it takes to retrieve at least X shards in the different subsets of the X+Y shards.

As shown in FIG. 4, the probabilities of exceeding different read latency limits for retrieving at least X shards based on requesting different subsets of the X+Y shards are indicated by the four dashed curves, and the probability of exceeding the different read latency time limits when retrieving all of the X+Y shards is indicated with the solid curve. The probabilities shown in FIG. 4 are expressed in orders of magnitude on a logarithmic scale. These probabilities may, for example, be the result of numerous simulations or information collected from previous performance of the data storage system or DSD including the MPs. In other implementations, the latency limits may be expressed in terms of threshold values rather than time limits.

FIG. 4 shows that the latency of retrieving the minimum number of shards required for data reconstruction (i.e., X) is dependent on the number of shards requested as well as the particular shards selected as part of that request. Dashed curves $X_1$, $X_1+1$ and $X_1+2$ show the effect of varying the number of shards requested. The dashed curve for $X_1$ includes a particular subset of X shards selected by shard calibration module 16 based on a comparison of at least one collective latency indicator to latency limit 402. In selecting subset $X_1$, shard calibration module 16 may compare different collective latency indicators for different groups of X shards in the X+Y shard set. As shown in FIG. 4, the probability of exceeding latency limit 402 (i.e., approximately 60 ms) when retrieving subset $X_1$ is approximately $1 \times 10^{-3.5}$.

By adding an extra shard to be retrieved to $X_1$, i.e., $X_1+1$, the probability of exceeding latency limit 402 approaches zero to retrieve the first X shards of the $X_1+1$ subset. Under the convention set forth above, Y=1 in this example. The probability of exceeding a first lower latency limit 404 of approximately 40 ms is approximately $1 \times 10^{-4}$. Although sending an additional read command for the extra shard may add more processing overhead, including the additional shard in the subset increases the likelihood of receiving the first X shards by latency limit 402.

By adding yet another shard to the original subset of shards with $X_1+2$ (i.e., Y=2), the probability of the latency of retrieving the first X shards exceeding the first lower latency limit 404 of approximately 40 ms approaches zero, and the probability of exceeding an even lower second latency limit 406 of approximately 20 ms is approximately $1 \times 10^{-3}$.

Besides varying the number of shards selected, in another example, shard calibration module 16 may select a different subset of X shards to retrieve by selecting subset $X_2$ instead of subset $X_1$. As shown by the dashed curve for subset $X_2$, the probability of exceeding the first lower latency limit 404 approaches zero when retrieving the subset $X_2$.

Figure 5:
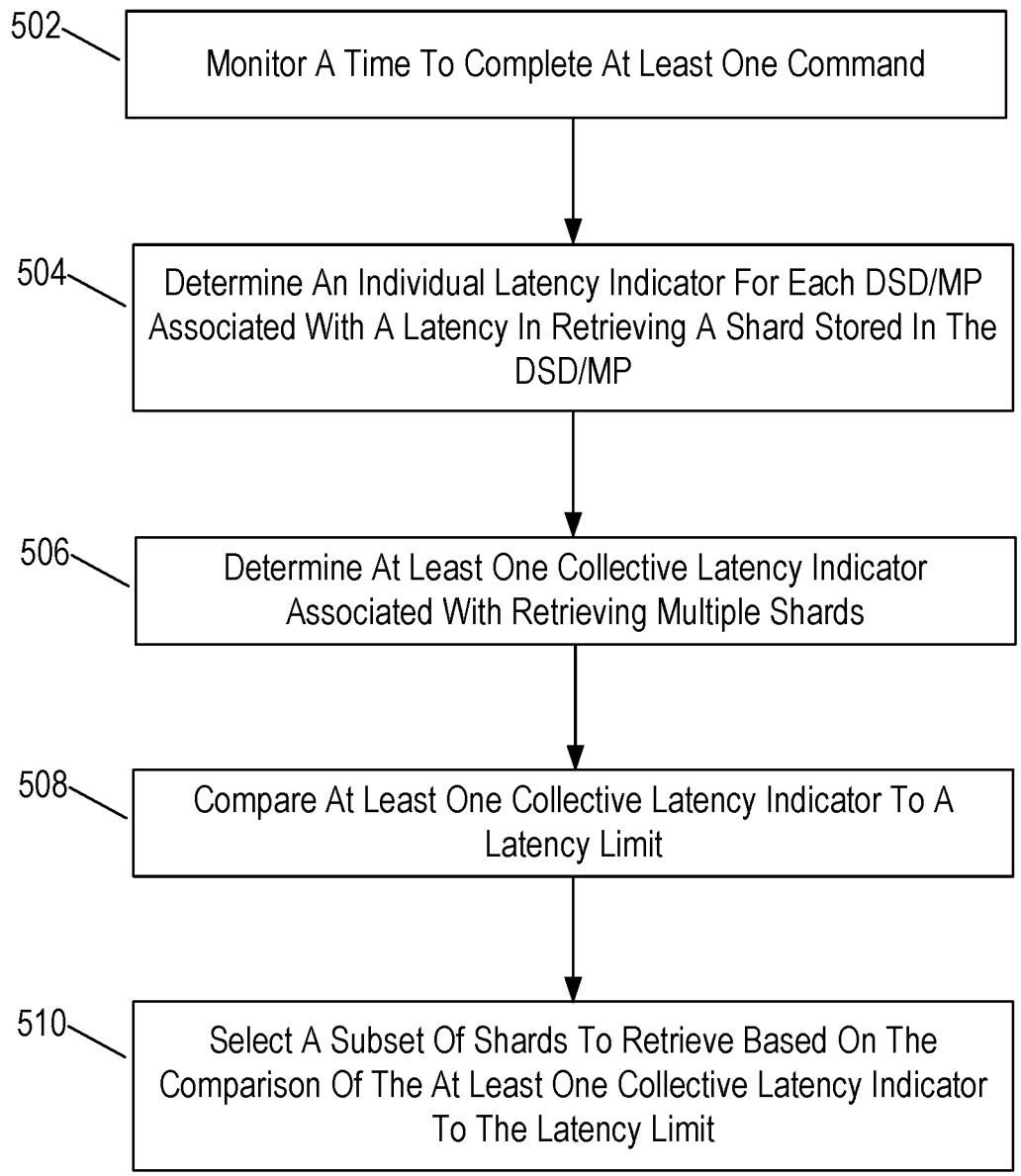
FIG. 5 is a flowchart for a shard calibration process using individual latency indicators for different DSDs or MPs according to an embodiment.

FIG. 5 is a flowchart for a shard calibration process using a collective latency indicator according to an embodiment. The process of FIG. 5 can be performed when executing application 10, for example, by controller 101 of FIG. 1A where multiple DSDs are managed by an external controller, by controller 114 in FIG. 1B where multiple MPs within a DSD are managed by an internal controller, by processor 154 in FIG. 1C where a host manages multiple DSDs, or by controller 124 in FIG. 1D where a DSD manages data retrieval from other DSDs in a data storage system.

In some implementations, the shard calibration process of FIG. 5 may be performed after running DSDs in a data storage system or MPs in a DSD for a predetermined amount of time or after a predetermined number of operations to collect enough information on command latencies. The shard calibration process may also be run periodically throughout operation, upon a request from a user or an application, and/or upon certain changes in the data storage system or DSD, such as with a change in the number of DSDs or MPs. In yet other implementations, the shard calibration process of FIG. 5 may be triggered by an indication from latency monitoring module 14 that the latency limit has been exceeded or was close to being exceeded in performing a read command. The process of FIG. 5 may be triggered in some implementations after receiving a read command from a host for erasure coded data, such as when receiving a read command from an application executing on host 151 in FIG. 1C or from host 150 in FIG. 1A, 1B, or 1D.

In block 502, latency monitoring module 14 monitors a time to complete at least one command. The monitored commands can, for example, be for reading or writing an erasure coded shard or for reading or writing other types of data. In some implementations, latency monitoring module 14 may time the completion of each read command and log command completion times for each DSD or MP. Alternatively, each DSD or MP sub-controller may log its own command completion times and return the command completion times to latency monitoring module 14. Latency monitoring module 14 may average the time to complete multiple commands or may receive status information from a DSD or MP sub-controller indicating an average time to complete commands.

The monitored time to complete at least one command in block 502 can also include simulating an operational stress, such as by forcing additional device background activity including, for example, garbage collection, defragmentation, wear leveling, or resource overprovisioning. Environmental stress conditions may also be simulated when monitoring the time to complete one or more commands by performing, for example, a temperature or vibration compensation operation. Simulating such stresses can account for scenarios where the performance of commands is delayed in the data storage system or the DSD.

In block 504, latency monitoring module 14 determines an individual latency indicator for each DSD or MP associated with a latency in retrieving a shard stored in the DSD or MP. In some implementations, latency monitoring module 14 may use the monitored times from block 502 to determine the individual latency indicators. The individual latency indicators determined in block 504 may represent retrieving shards during operational and/or environmental stress conditions if the monitoring in block 502 included simulating such stress conditions.

In other implementations, latency monitoring module 14 may alternatively consider, or consider in addition to monitored command completion time, characteristics of the DSD or MP. Such characteristics may include, for example, a storage media type or tier (e.g., MRAM, NAND flash, or rotating magnetic media), a command queue depth of commands waiting to be performed, an age or indication of health of the DSD or MP (e.g., an read error rate or read retry count), or an available storage capacity of the DSD or MP. Each of these characteristics may have an effect on the time it takes to retrieve a shard from the DSD or the MP. Other implementations may consider different characteristics in determining an individual latency indicator.

In block 506 of FIG. 5, shard calibration module 16 determines at least one collective latency indicator associated with a latency in retrieving multiple erasure coded shards. In some implementations, a collective latency indicator can include the largest or longest of the set of individual latency indicators for DSDs or MPs storing each shard. In other implementations, the collective latency indicator can include an average of the individual latency indicators. In yet other implementations, shard calibration module 16 may use the individual latency indicators as weights assigned to each DSD or MP that affect an average read completion time. In this regard, the collective latency indicator may include an estimate of an expected time to retrieve the shards in the group or may include a different value corresponding to a time to retrieve the shards in the group.

In block 508, shard calibration module 16 compares one or more collective latency indicators determined in block 506 to a latency limit. The latency limit can include, for example, a time limit to meet a design specification (e.g., latency limit 402 in FIG. 4) or other value corresponding to a latency limit. In some implementations, shard calibration module 16 may also consider a probability target in comparing collective latency indicators to the latency limit. The probability target may specify, for example, a probability of exceeding the latency limit when retrieving the shards for the collective latency indicator. For example, in the case of subset $X_1$ in FIG. 4, the target probability for exceeding latency limit 402 can be $1 \times 10^{-3.5}$.

In block 510, shard calibration module 16 selects a subset of erasure coded shards to retrieve based on the comparison of one or more collective latency indicators to the latency limit in block 508. Shard calibration module 16 may select a subset of shards associated with a collective latency indicator corresponding to a shortest time to retrieve the shards in the subset. In such implementations, shard calibration module 16 may select a subset of shards so that lower latency DSDs or MPs are given a statistical preference. The statistical preference may be secondary to or tempered by other algorithms such as giving a higher priority to shards stored in DSDs or MPs that are idle or to consider load balancing among the DSDs or MPs.

In other implementations, shard calibration module 16 may instead select a subset of shards with a collective latency indicator corresponding to a time closest to the latency limit. In yet other implementations, shard calibration module 16 may select the first subset of shards determined to provide a collective latency indicator corresponding to a time less than the latency limit, and stop considering additional collective latency indicators for other subsets of shards.

Figure 6:
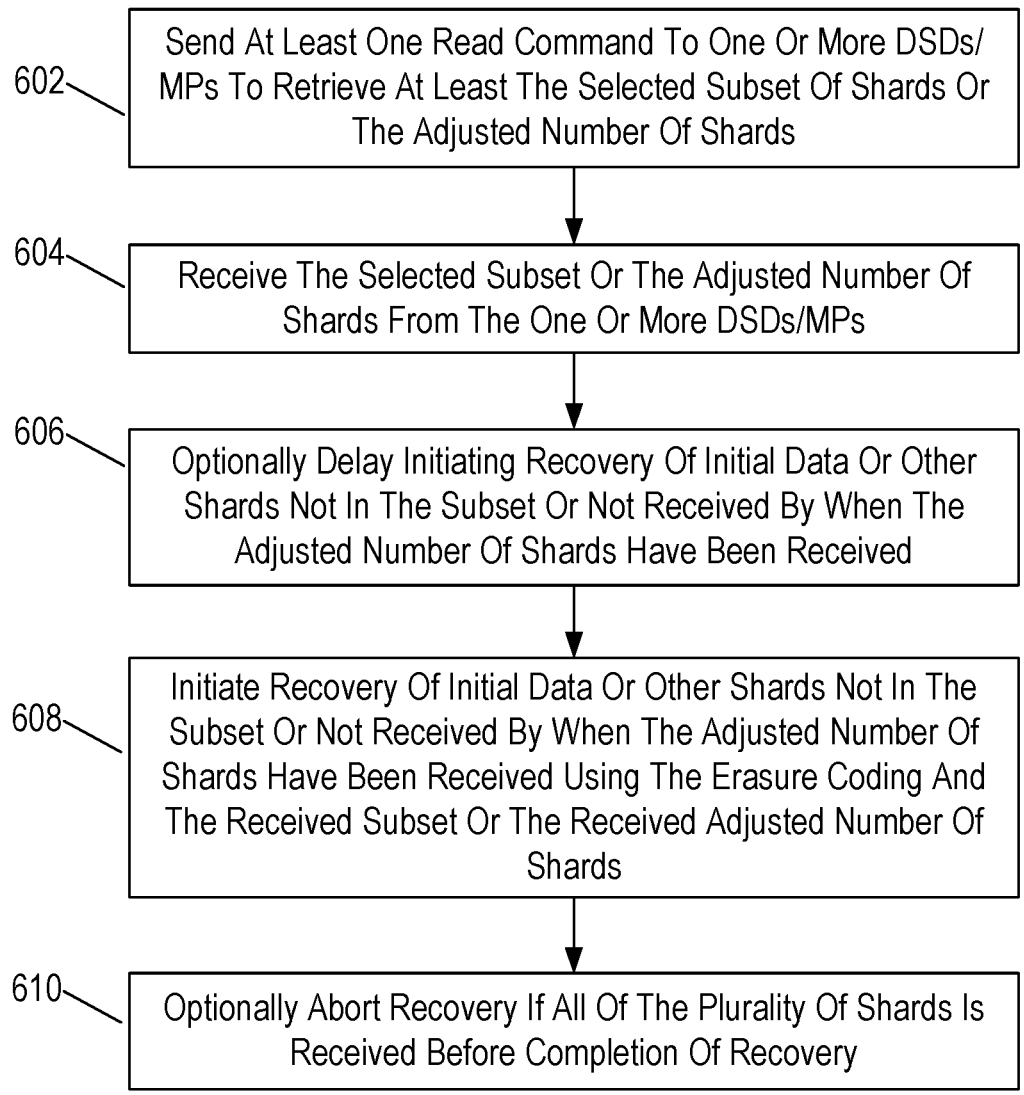
FIG. 6 is a flowchart for a read process for retrieving erasure coded shards and initiating recovery of initial data or unreceived shards according to an embodiment.

FIG. 6 is a flowchart for a read process for retrieving erasure coded shards and initiating recovery of initial data according to an embodiment. As with the shard calibration process of FIG. 5, the read process of FIG. 6 can be performed when executing application 10, for example, by controller 101 of FIG. 1A, by controller 114 of FIG. 1B, by processor 154 of FIG. 1C, or by controller 124 of FIG. 1D.

In block 602, at least one read command is sent to one or more DSDs or MPs to retrieve at least a selected subset of erasure coded shards or an adjusted number of erasure coded shards. Block 602 may follow a shard calibration process, such as the shard calibration process of FIG. 5 or the shard calibration process of FIG. 1C discussed below.

In block 604, the selected subset or adjusted number of shards are received from one or more DSDs or MPs. In block 606, the controller or processor may delay recovery of the initial data or recovery of the unreceived shards. The unreceived shards may be shards that have not been received by the time recovery begins or shards that were not requested as part of a subset in block 602.

The initial data may be requested by a host read command, and can be recovered using the erasure coding and at least a minimum number of shards needed to recover the initial data (e.g., 13 shards needed for recovery with EC 13/18). Generally, the time to decode the initial data is shorter when using more than the minimum number of shards, with the time to decode decreasing approximately linearly with each additional shard. In some cases, receiving less than all of the shards can slightly increase a mean time for the overall completion of read commands, due to the increase in time to decode the requested data with less shards. However, beginning the decoding of the requested data before receiving all of the erasure coded shards can reduce the likelihood of incurring a long read tail latency where a last shard may take significantly longer (e.g., several times longer) to retrieve than the other shards. Delaying the recovery of the requested data in block 606 can allow for more time for receiving additional shards to shorten the decode time, while still reducing the impact of a significantly long read tail latency.

In some situations, shards may be retrieved as part of a background or maintenance activity to reconstruct shards that could not be retrieved for earlier read commands. Delaying recovery of the such shards in block 606 can similarly allow more time for receiving additional shards to shorten the time to recover the other shards.

In block 608, the controller or processor initiates recovery of the initial data or the unreceived shards using the erasure coding and the received shards. In block 610, the controller or processor optionally aborts recovery of the initial data or the unreceived shards if all of the shards are received before completing recovery. In this regard, it is possible that the reduction in decode time by using all of the shards may be greater than the reduction in the latency caused by waiting for the last shard to be received. Aborting recovery may not be as useful in implementations where a delay has been introduced in block 606 since additional time has been allocated for receiving more shards. In such implementations, block 610 may not be performed.

Figure 7:
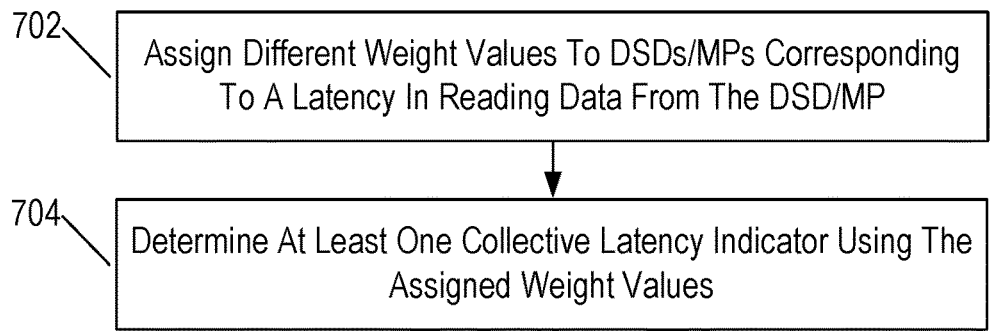
FIG. 7 is a flowchart for a collective latency determination process using assigned weight values according to an embodiment.

FIG. 7 is a flowchart for a collective latency determination process using assigned weight values according to an embodiment. The collective latency determination process of FIG. 7 can be performed when executing application 10, for example, by controller 101 of FIG. 1A, by controller 114 of FIG. 1B, by processor 154 of FIG. 1C, or by controller 124 of FIG. 1D. The process of FIG. 7 may serve as a sub-process of a shard calibration process such as the shard calibration process of FIG. 5 or FIG. 10 to determine one or more collective latency indicators for retrieving different groups of shards.

In block 702, shard calibration module 16 or latency monitoring module 14 assigns different weight values to DSDs or MPs, with each weight value corresponding to a latency in retrieving data from the DSD or MP. The weight values may correspond to individual latency indicators as discussed above for block 504 of FIG. 5 or can correspond to information collected about the different DSDs or MPs. In one implementation, shard calibration module 16 assigns higher weights to DSDs or MPs that have a lower mean latency for retrieving shards stored in the DSD or MP.

In block 704, shard calibration module 16 determines at least one collective latency indicator using the assigned weight values. In some implementations, shard calibration module 16 may use the weights in calculating an expected time to retrieve the shards represented by the collective latency indicator. In other implementations, an average read completion time for a data storage system or DSD may be used in a mathematical operation (e.g., multiplication, division, etc.) with each weight value to identify a largest or smallest result that is determined to be the collective latency indicator for the group of DSDs or MPs. In such implementations, shard calibration module 16 may select a subset of shards so that lower latency DSDs or MPs are given a statistical preference. The statistical preference may be secondary to or tempered by other algorithms such as giving a higher priority to shards stored in DSDs or MPs that are idle or to consider load balancing among the DSDs or MPs.

Figure 8:
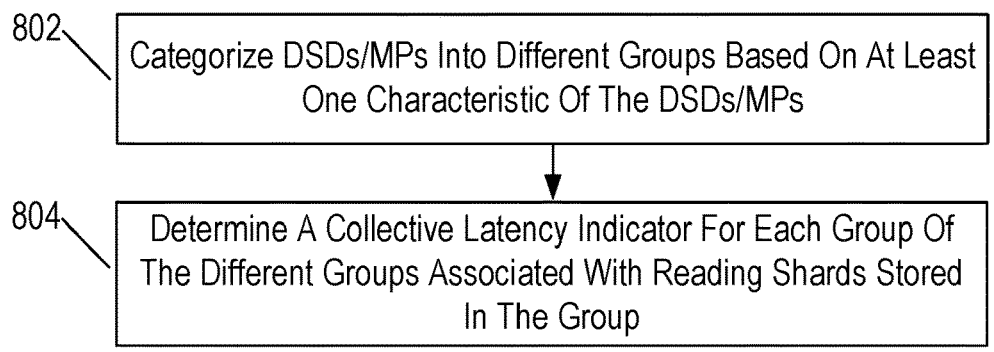
FIG. 8 is a flowchart for a collective latency determination process including categorizing DSDs or MPs into different groups based on at least one characteristic of the DSDs or MPs according to an embodiment.

FIG. 8 is a flowchart for a collective latency determination process including categorizing DSDs or MPs into different groups based on at least one characteristic of the DSDs or MPs according to an embodiment. The collective latency determination process of FIG. 8 can be performed when executing application 10, for example, by controller 101 of FIG. 1A, by controller 114 of FIG. 1B, by processor 154 of FIG. 1C, or by controller 124 of FIG. 1D. The process of FIG. 8 may serve as a sub-process of a shard calibration process such as the shard calibration process of FIG. 5 or FIG. 10 to determine one or more collective latency indicators for retrieving different groups of shards.

In block 802, shard calibration module 16 categorizes DSDs or MPs into different groups based on at least one characteristic shared by the DSDs or MPs in the group. One or more characteristics may be used to categorize the DSDs or MPs, such as by different activity levels for the DSDs or MPs, and/or by different physical characteristics of the DSDs or MPs. The activity level of a particular DSD or MP may, for example, indicate a range in the number of pending commands (e.g., write commands and/or read commands) queued for the DSD or MP, a range of average command queue depths over a predetermined period of time, a range of times to complete a command, or a range of average times to complete commands.

A physical characteristic of a particular DSD or MP may include, for example, a storage media type (e.g., rotating magnetic disk or solid-state memory), a location on a network, an age of the DSD or MP, a remaining available storage capacity of the DSD or MP, or a read speed specified for the DSD or MP. In this regard, certain DSDs or MPs may have a faster read speed than other DSDs or MPs due to physical differences such as having a faster actuator for seeking to a location on a disk, being able to rotate a disk at a higher rotational speed, or using a physically different type of solid-state memory (e.g., MRAM versus NAND, the number of bits per cell at which the memory is read, etc.).

For example, one or more of the DSDs in a data storage system can form a first group including a first type of storage media (e.g., magnetic disk storage media) associated with an expected first read latency, and one or more of the DSDs in the data storage system can form a second group including a second type of storage media (e.g., solid-state storage media) associated with an expected second read latency different from the first expected read latency. Shard calibration module 16 may determine a collective latency indicator for shards stored in the first group that indicates a longer latency than a collective latency indicator for shards stored in the second group. Other examples may group shards based on different characteristics of the DSDs or MPs storing the shards.

Figure 9:
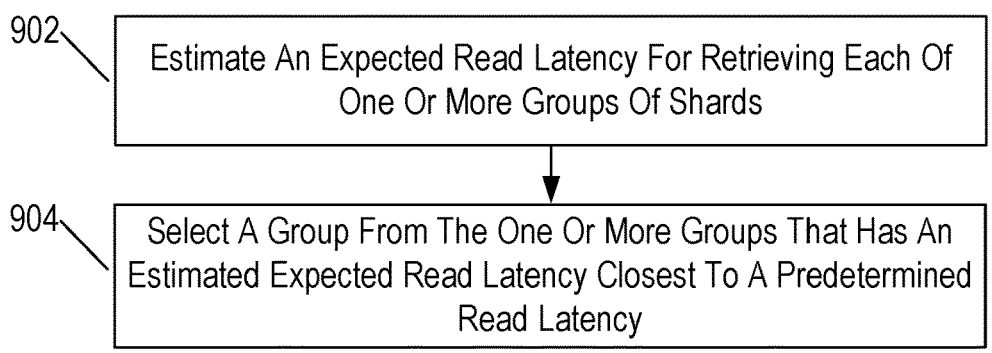
FIG. 9 is a flowchart for a shard group selection process based on estimating an expected latency in retrieving the shards according to an embodiment.

FIG. 9 is a flowchart for a shard group selection process based on an expected latency in retrieving the shards according to an embodiment. The shard group selection process of FIG. 9 can be performed when executing application 10, for example, by controller 101 of FIG. 1A, by controller 114 of FIG. 1B, by processor 154 of FIG. 1C, or by controller 124 of FIG. 1D. The process of FIG. 9 may serve as a sub-process of a shard calibration process such as the shard calibration process of FIG. 5 where a subset of shards are selected in block 510.

In block 902, shard calibration module 16 estimates an expected read latency for retrieving each of one or more groups of shards. In some implementations, shard calibration module 16 may use a latency history or logged command completion times to build a probability model that describes an expected read latency for each DSD or MP based on a size of the requested data. In such implementations, the probability model may also consider other factors such as a time of day or system activity level. In other implementations, the expected read latency may only consider an average command completion time for the DSD or MP.

In block 904, shard calibration module 16 selects a group of shards that has an expected read latency closest to a predetermined read latency. In one example, a read command from a host may need to comply with a SLA requiring that 99% of all read commands are completed within 50 ms. Shard calibration module 16 can select a subset of shards that comes closest to meeting the 50 ms latency limit with a probability target of less than 1% of commands exceeding the latency limit.

Figure 10:
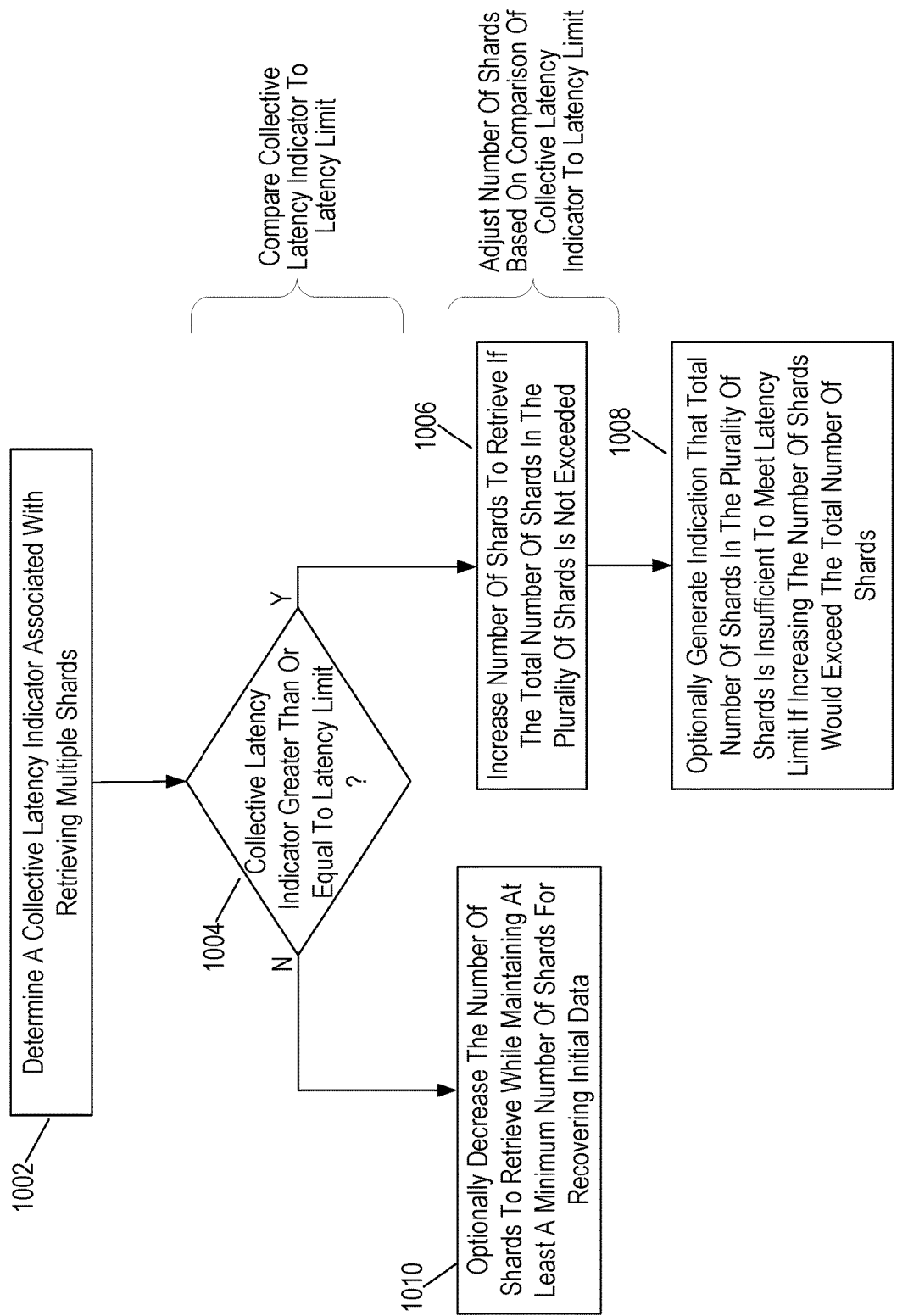
FIG. 10 is a flowchart for a shard calibration process including adjusting a number of erasure coded shards to retrieve based on a comparison of a collective latency indicator to a latency limit according to an embodiment.

FIG. 10 is a flowchart for a shard calibration process including adjusting a number of erasure coded shards to retrieve based on a comparison of at least one collective latency indicator to a latency limit according to an embodiment. The shard calibration process of FIG. 10 can be performed when executing application 10, for example, by controller 101 of FIG. 1A, by controller 114 of FIG. 1B, by processor 154 of FIG. 1C, or by controller 124 of FIG. 1D.

In some implementations, the shard calibration process of FIG. 10 may be performed after operating DSDs in a data storage system or MPs in a DSD for a predetermined amount of time or after a predetermined number of operations to collect sufficient information on read latencies. The shard calibration process may also be run periodically throughout the operation of the data storage system or DSD, upon a request from a user or an application, and/or upon certain changes in the DSD or data storage system, such as with a change in the number of DSDs or MPs. In yet other implementations, the shard calibration process of FIG. 10 may be triggered by an indication from latency monitoring module 14 that the latency limit has been exceeded or was close to being exceeded in performing a read command. The process of FIG. 10 may be triggered in some implementations after receiving a read command from a host for erasure coded data, such as when receiving a read command from an application executing on host 151 in FIG. 1C or from host 150 in FIG. 1A, 1B, or 1D.

In comparison to the shard calibration process of FIG. 5, the shard calibration process of FIG. 10 adjusts the number of shards to be retrieved rather than selecting a particular subset of shards. The shard calibration processes of FIGS. 5 and 10 may be performed independently of each other, in place of each other, or combined to select both a subset of shards to retrieve and set a particular number of shards to retrieve. The number of shards to retrieve may remain set between iterations of the process of FIG. 10.

In block 1002, shard calibration module 16 determines a collective latency indicator associated with a latency in retrieving a current number of shards. In some implementations, the collective latency indicator can be based on monitored command completion times from latency monitoring module 14, such as an average time for completing a read command from a host or a slowest percentage of command completion times using a current number of shards that are retrieved for read commands. In other implementations, the collective latency indicator can be determined using individual latency indicators for different DSDs or MPs as described above with reference to blocks 504 and 506 in FIG. 5.

During a first iteration of the shard calibration process of FIG. 10, the collective latency indicator may reflect an initial or default setting for a number of shards to retrieve. In some implementations, the initial number of shards to retrieve can be set at one shard more than the minimum number of shards needed to recover the initial data (i.e., X+1 shards). In other implementations, the initial number of shards to retrieve can be set at the full number of shards (i.e., X+Y shards).

In block 1004, shard calibration module 16 compares the collective latency indicator to a latency limit by determining whether the collective latency indicator is greater than or equal to the latency limit. If so, shard calibration module 16 in block 1006 increases the number of shards to be retrieved. Shard calibration module 16 may increase the number of shards incrementally by adding one shard or may increase the number of shards by more than one shard based on the amount by which the collective latency indicator exceeds the latency limit in block 1004.

In other embodiments, shard calibration module 16 may determine in block 1004 whether the collective latency indicator is within a predetermined range below the latency limit, and increase the number of shards to retrieve in block 1006 if the collective latency is within the predetermined range below the latency limit. This can ordinarily allow for read latencies in the data storage system or DSD to be adjusted before exceeding or reaching the latency limit.

The number of shards to read may be increased in block 1006 up to the total number of shards stored. If increasing the number of shards to read in block 1006 would exceed the total number of shards, shard calibration module in block 1008 may optionally generate an indication that the total number of shards is insufficient to meet the latency limit. This notification may be sent, for example, to a host or application requesting performance of a read command or to another device or application responsible for managing the storage of shards in the data storage system or DSD.

On the other hand, if it is determined that the collective latency indicator in block 1004 is less than the latency limit, shard calibration module 16 in block 1010 may optionally decrease the number of shards to be read while maintaining at least a minimum number of shards for recovering the initial data. Decreasing the number of shards to read can reduce an overhead in performing read commands for erasure coded data by reducing the number of read commands that are sent to retrieve the shards. Shard calibration module 16 may decrease the number of shards incrementally by subtracting one shard or may decrease the number of shards by more than one shard based on the amount by which the collective latency indicator is less than the latency limit in block 1004.

In other embodiments, shard calibration module 16 may determine in block 1004 whether the collective latency indicator is within a predetermined range above a low latency limit less than the latency limit, and decrease the number of shards to retrieve in block 1010 if the collective latency is within the predetermined range above the low latency limit. This can ordinarily help balance the overhead associated with sending additional read commands against reducing a read tail latency in retrieving shards.

As discussed above, the processes and systems disclosed herein can ordinarily reduce read tail latencies when performing a read command for erasure coded data by selecting a particular subset of erasure coded shards to retrieve from a full set of erasure coded shards and/or by setting a number of erasure coded shards to retrieve.

Other Embodiments

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor or computer to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, and controllers described in connection with the examples disclosed herein may be implemented or performed with a general purpose processor, a DSP, an ASIC, a FPGA or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The activities of a method or process described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A data storage system, comprising:
    a plurality of Data Storage Devices (DSDs) for storing a plurality of erasure coded shards, each DSD of the plurality of DSDs for storing one or more erasure coded shards of the plurality of erasure coded shards, wherein the plurality of erasure coded shards is generated from an erasure coding on initial data; and
    a controller configured to:
        set an initial number of the erasure coded shards to retrieve from the plurality of DSDs;
        determine a collective latency indicator associated with a latency in retrieving the initial number of erasure coded shards of the plurality of erasure coded shards, wherein the collective latency indicator is based on a predetermined percentage of the slower times to complete a read command for each of a plurality of particular subsets of the initial number of erasure coded shards;
        compare the collective latency indicator to a latency limit to determine whether the collective latency indicator is (a) greater than or equal to the latency limit or (b) less than the latency limit; and
        adjust the number of erasure coded shards to retrieve to reduce read tail latency based on whether the collective latency indicator is greater than or equal to or is less than the latency limit.

2. The data storage system of claim 1, wherein the controller is further configured to:
    determine an individual latency indicator for each DSD of the plurality of DSDs, wherein each individual latency indicator is associated with a latency in retrieving an erasure coded shard of the initial number of erasure coded shards stored in a respective DSD; and
    determine the collective latency indicator using determined individual latency indicators.

3. The data storage system of claim 1, wherein the controller is further configured to:
    send at least one read command to one or more DSDs of the plurality of DSDs to retrieve at least the adjusted number of erasure coded shards;
    receive the adjusted number of erasure coded shards from the one or more DSDs; and
    initiate recovery of the initial data or unreceived erasure coded shards not received by when the adjusted number of erasure coded shards have been received, wherein the recovery is performed using the erasure coding and the received adjusted number of erasure coded shards.

4. The data storage system of claim 3, wherein:
    the at least one read command is sent to the plurality of DSDs to retrieve the plurality of erasure coded shards, and
    the controller is further configured to abort recovery of the initial data or the unreceived erasure coded shards if all of the plurality of erasure coded shards is received before recovery is completed.

5. The data storage system of claim 3, wherein:
    the at least one read command is sent to the plurality of DSDs to retrieve the plurality of erasure coded shards, and
    the controller is further configured to delay initiating the recovery of the initial data or the unreceived erasure coded shards to allow additional time for receiving one or more of the unreceived erasure coded shards before initiating recovery of the initial data or the unreceived erasure coded shards.

6. The data storage system of claim 1, wherein the controller is further configured to:
    increase the number of erasure coded shards to retrieve if the collective latency indicator is greater than or equal to the latency limit.

7. The data storage system of claim 6, wherein the controller is further configured to:
    determine whether the increased number of erasure coded shards exceeds the total number of the plurality of erasure coded shards; and
    generate an indication that the total number of the plurality of erasure coded shards is insufficient to meet the latency limit.

8. The data storage system of claim 1, wherein the controller is further configured to:
    decrease the number of erasure coded shards to retrieve if the collective latency indicator is less than the latency limit.

9. The data storage system of claim 8, wherein the controller is further configured to:
    determine whether decreasing the number of erasure coded shards would fall below a minimum number of erasure coded shards for recovering the initial data; and
    maintain the number of erasure coded shards to retrieve if the decreased number of erasure coded shards would fall below the minimum number of erasure coded shards.

10. The data storage system of claim 1, wherein the controller is further configured to:
    determine whether the collective latency indicator is within a predetermined range below the latency limit; and
    increase the number of erasure coded shards to read if the collective latency indicator is within the predetermined range below the latency limit.

11. The data storage system of claim 1, wherein the controller is further configured to:
   determine whether the collective latency indicator is within a predetermined range above a low latency limit that is less than the latency limit; and
   decrease the number of erasure coded shards to retrieve if the collective latency indicator is within the predetermined range above the low latency limit.

12. A method of reading data in a data storage system including a plurality of Data Storage Devices (DSDs) storing a plurality of erasure coded shards, each DSD of the plurality of DSDs storing one or more erasure coded shards of the plurality of erasure coded shards, wherein the plurality of erasure coded shards is generated from an erasure coding on initial data, the method comprising:
   setting an initial number of the erasure coded shards to retrieve from the plurality of DSDs;
   determining a collective latency indicator associated with a latency in retrieving the initial number of erasure coded shards of the plurality of erasure coded shards, wherein the collective latency indicator is based on a predetermined percentage of the slower times to complete a read command for each of a plurality of particular subsets of the initial number of erasure coded shards;
   comparing the collective latency indicator to a latency limit to determine whether the collective latency indicator is (a) greater than or equal to the latency limit or (b) less than the latency limit; and
   adjusting the number of erasure coded shards to retrieve to reduce read tail latency based on whether the collective latency indicator is greater than or equal to or is less than the latency limit.

13. The method of claim 12, further comprising:
   determining an individual latency indicator for each DSD of the plurality of DSDs, wherein each individual latency indicator is associated with a latency in retrieving an erasure coded shard of the initial number of erasure coded shards stored in a respective DSD; and
   determining the collective latency indicator using determined individual latency indicators.

14. The method of claim 12, further comprising:
   sending at least one read command to one or more DSDs of the plurality of DSDs to retrieve at least the adjusted number of erasure coded shards;
   receiving the adjusted number of erasure coded shards from the one or more DSDs; and
   initiating recovery of the initial data or unreceived erasure coded shards not received by when the adjusted number of erasure coded shards have been received, wherein the recovery is performed using the erasure coding and the received adjusted number of erasure coded shards.

15. The method of claim 14, wherein:
   the at least one read command is sent to the plurality of DSDs to retrieve the plurality of erasure coded shards, and
   the method further comprises aborting recovery of the initial data or the unreceived erasure coded shards if all of the plurality of erasure coded shards is received before recovery is completed.

16. The method of claim 14, wherein:
   the at least one read command is sent to the plurality of DSDs to retrieve the plurality of erasure coded shards, and
   the method further comprises delaying initiating the recovery of the initial data or the unreceived erasure coded shards to allow additional time for receiving one or more of the unreceived erasure coded shards before initiating recovery of the initial data or the unreceived erasure coded shards.

17. The method of claim 12, further comprising:
   increasing the number of erasure coded shards to retrieve if the collective latency indicator is greater than or equal to the latency limit.

18. The method of claim 17, further comprising:
   determining whether the increased number of erasure coded shards exceeds the total number of the plurality of erasure coded shards; and
   generating an indication that the total number of the plurality of erasure coded shards is insufficient to meet the latency limit.

19. The method of claim 12, further comprising:
   decreasing the number of erasure coded shards to retrieve if the collective latency indicator is less than the latency limit.

20. The method of claim 19, further comprising:
   determining whether decreasing the number of erasure coded shards would fall below a minimum number of erasure coded shards for recovering the initial data; and
   maintaining the number of erasure coded shards to retrieve if the decreased number of erasure coded shards would fall below the minimum number of erasure coded shards.

21. The method of claim 12, further comprising:
   determining whether the collective latency indicator is within a predetermined range below the latency limit; and
   increasing the number of erasure coded shards to retrieve if the collective latency indicator is within the predetermined range below the latency limit.

22. The method of claim 12, further comprising:
   determining whether the collective latency indicator is within a predetermined range above a low latency limit that is less than the latency limit; and
   decreasing the number of erasure coded shards to retrieve if the collective latency indicator is within the predetermined range above the low latency limit.

23. A Data Storage Device (DSD), comprising:
   a plurality of memory portions for storing a plurality of erasure coded shards, each memory portion of the plurality of memory portions for storing one or more erasure coded shards of the plurality of erasure coded shards, wherein the plurality of erasure coded shards is generated from an erasure coding on initial data; and
   a controller configured to:
      set an initial number of the erasure coded shards to retrieve from the plurality of DSDs;
      determine a collective latency indicator associated with retrieving the initial number of erasure coded shards in the plurality of erasure coded shards, wherein the collective latency indicator is based on a predetermined percentage of the slower times to complete a read command for each of a plurality of particular subsets of the initial number of erasure coded shards;
      compare the collective latency indicator to a latency limit to determine whether the collective latency indicator is (a) greater than or equal to the latency limit or (b) less than the latency limit; and
      adjust the number of erasure coded shards to retrieve to reduce read tail latency based on whether the collective latency indicator is greater than or equal to or is less than the latency limit.

24. A host, comprising:
an interface for communicating with a data storage system including a plurality of Data Storage Devices (DSDs) storing a plurality of erasure coded shards, each DSD of the plurality of DSDs storing one or more erasure coded shards of the plurality of erasure coded shards, wherein the plurality of erasure coded shards is generated from an erasure coding on initial data; and
a processor configured to:
set an initial number of the erasure coded shards to retrieve from the plurality of DSDs;
determine a collective latency indicator associated with retrieving the initial number of erasure coded shards in the plurality of erasure coded shards, wherein the collective latency indicator is based on a predetermined percentage of the slower times to complete a read command for each of a plurality of particular subsets of the initial number of erasure coded shards;
compare the collective latency indicator to a latency limit to determine whether the collective latency indicator is (a) greater than or equal to the latency limit or (b) less than the latency limit; and
adjust the number of erasure coded shards to retrieve to reduce read tail latency based on whether the collective latency indicator is greater than or equal to or is less than the latency limit.

25. A Data Storage Device (DSD) for use in a data storage system including a plurality of DSDs storing a plurality of erasure coded shards, each DSD of the plurality of DSDs storing one or more erasure coded shards of the plurality of erasure coded shards, wherein the plurality of erasure coded shards is generated from an erasure coding on initial data, the DSD comprising:
an interface for communicating with the plurality of DSDs; and
a controller configured to:
set an initial number of the erasure coded shards to retrieve from the plurality of DSDs;
determine a collective latency indicator associated with retrieving the initial number of erasure coded shards in the plurality of erasure coded shards, wherein the collective latency indicator is based on a predetermined percentage of the slower times to complete a read command for each of a plurality of particular subsets of the initial number of erasure coded shards;
compare the collective latency indicator to a latency limit to determine whether the collective latency indicator is (a) greater than or equal to the latency limit or (b) less than the latency limit; and
adjust the number of erasure coded shards to retrieve to reduce read tail latency based on whether the collective latency indicator is greater than or equal to or is less than the latency limit.

26. The data storage system of claim 6, wherein increasing the number of erasure coded shards to retrieve includes determining the increasing number of shards based on the amount by which the collective latency indicator exceeds the latency limit.

27. A Data Storage Device (DSD) comprising:
a plurality of memory portions storing a plurality of erasure coded shards, each memory portion of the plurality of memory portions storing one or more erasure coded shards of the plurality of erasure coded shards, wherein the plurality of erasure coded shards is generated from an erasure coding on initial data;
means for setting an initial number of the erasure coded shards to retrieve from the plurality of DSDs;
means for determining a collective latency indicator associated with retrieving the initial number of erasure coded shards in the plurality of erasure coded shards, wherein the collective latency indicator is based on a predetermined percentage of the slower times to complete a read command for each of a plurality of particular subsets of the initial number of erasure coded shards;
means for comparing the collective latency indicator to a latency limit to determine whether the collective latency indicator is (a) greater than or equal to the latency limit or (b) less than the latency limit; and
means for adjusting the number of erasure coded shards to retrieve to reduce read tail latency based on whether the collective latency indicator is greater than or equal to or is less than the latency limit.

* * * * *